United States Patent
Sheu et al.

(10) Patent No.: US 10,636,655 B2
(45) Date of Patent: Apr. 28, 2020

(54) METHODS FOR ASYMMETRIC DEPOSITION OF METAL ON HIGH ASPECT RATIO NANOSTRUCTURES

(71) Applicant: APPLIED MATERIALS, INC., Santa Clara, CA (US)

(72) Inventors: Ben-Li Sheu, Sunnyvale, CA (US); Bencherki Mebarki, Santa Clara, CA (US); Joung Joo Lee, San Jose, CA (US); Ismail Emesh, Sunnyvale, CA (US); Roey Shaviv, Palo Alto, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/924,821

(22) Filed: Mar. 19, 2018

(65) Prior Publication Data
US 2019/0287791 A1 Sep. 19, 2019

(51) Int. Cl.
*C23C 16/06* (2006.01)
*H05H 1/24* (2006.01)
(Continued)

(52) U.S. Cl.
CPC .... *H01L 21/0272* (2013.01); *C23C 16/45544* (2013.01); *H01L 21/02172* (2013.01); *H01L 21/28556* (2013.01); *H01L 21/7688* (2013.01)

(58) Field of Classification Search
CPC ......... C23C 16/06; C23C 16/30; C23C 16/50; H05H 1/24
See application file for complete search history.

(56) References Cited

U.S. PATENT DOCUMENTS

| 5,240,774 A | * | 8/1993 | Ogawa | B05D 1/185 156/278 |
| RE37,698 E | * | 5/2002 | Ogawa | B05D 1/185 427/337 |

(Continued)

FOREIGN PATENT DOCUMENTS

| JP | 2002-110654 A | | 4/2002 |
| JP | 2009-145827 | * | 7/2009 |

OTHER PUBLICATIONS

Sankaran, Arvind, et al., "Fluorocarbon plasma etching and profile evolution of porous low-dielectric-constant silica". Applied Physics Letters, vol. 82, No. 12, Mar. 24, 2003, pp. 1824-1826.*

(Continued)

*Primary Examiner* — Bret P Chen
(74) *Attorney, Agent, or Firm* — Moser Taboada; Alan Taboada

(57) ABSTRACT

Methods for asymmetric deposition of a material on a structure formed on a substrate are provided herein. In some embodiments, a method for asymmetric deposition of a material includes forming a plasma from a process gas comprising ionized fluorocarbon (CxFy) particles, depositing an asymmetric fluorocarbon (CxFy) polymer coating on a first sidewall and a bottom portion of an opening formed in a first dielectric layer using angled CxFy ions, depositing a metal, metallic nitride, or metallic oxide on a second sidewall of the opening, and removing the CxFy polymer coating from the first sidewall and the bottom portion of the opening to leave an asymmetric deposition of the metal, metallic nitride, or metallic oxide on the structure.

14 Claims, 6 Drawing Sheets

(51) Int. Cl.
*H01L 21/027* (2006.01)
*H01L 21/768* (2006.01)
*H01L 21/02* (2006.01)
*H01L 21/285* (2006.01)
*C23C 16/455* (2006.01)

(56) References Cited

U.S. PATENT DOCUMENTS

| | | |
|---|---|---|
| 6,750,116 B1 | 6/2004 | Chen |
| 6,784,096 B2 | 8/2004 | Chen et al. |
| RE39,045 E * | 3/2006 | Ogawa ............... B05D 1/185 427/409 |
| 9,716,005 B1 | 7/2017 | Godet et al. |
| 2004/0072443 A1* | 4/2004 | Huang ............ H01L 21/31116 438/710 |
| 2007/0108404 A1 | 5/2007 | Stewart et al. |
| 2008/0188081 A1* | 8/2008 | Chi ............... H01L 21/31116 438/700 |
| 2010/0167539 A1* | 7/2010 | Eun ............... H01L 21/76801 438/675 |
| 2010/0255683 A1 | 10/2010 | Godet et al. |
| 2011/0184214 A1* | 7/2011 | Hintzer .............. C07C 17/367 570/136 |
| 2011/0293547 A1* | 12/2011 | Geissler ............... C09C 1/0015 424/63 |
| 2013/0062309 A1* | 3/2013 | Godet ............... H01L 21/0273 216/41 |
| 2015/0099360 A1 | 4/2015 | Yieh et al. |
| 2015/0196873 A1* | 7/2015 | Hong .................. B01D 53/32 422/168 |
| 2015/0311073 A1* | 10/2015 | Srinivasan .......... H01L 29/0684 438/504 |
| 2016/0284520 A1 | 9/2016 | Likhanskii et al. |
| 2017/0350004 A1 | 12/2017 | Kaufman-Osborn et al. |

OTHER PUBLICATIONS

Cuddy, Michael F., et al., "Ion contributions to gas-surface interactions in inductively-coupled fluoricarbon plasmas". International Journal of Mass Spectrometry, 330-332 (2012) 46-57.*

Stoffels, W.W., et al., "Polymerization of fluorocarbons in reactive ion etching plasmas". Journal of Vacuum Science & Technology A, 16, 87 (1998), Abstract, no page numbers.*

Agraharam, Sairam, et al., "Plasma chemistry in fluorocarbon film deposition from pentafluoroethane/argon mixtures". Journal of Vacuum Science & Technology A, 17(6), Nov./Dec. 1999, 3265-3271.*

International Search Report for PCT/US2019/022219, dated Jun. 28, 2019.

* cited by examiner

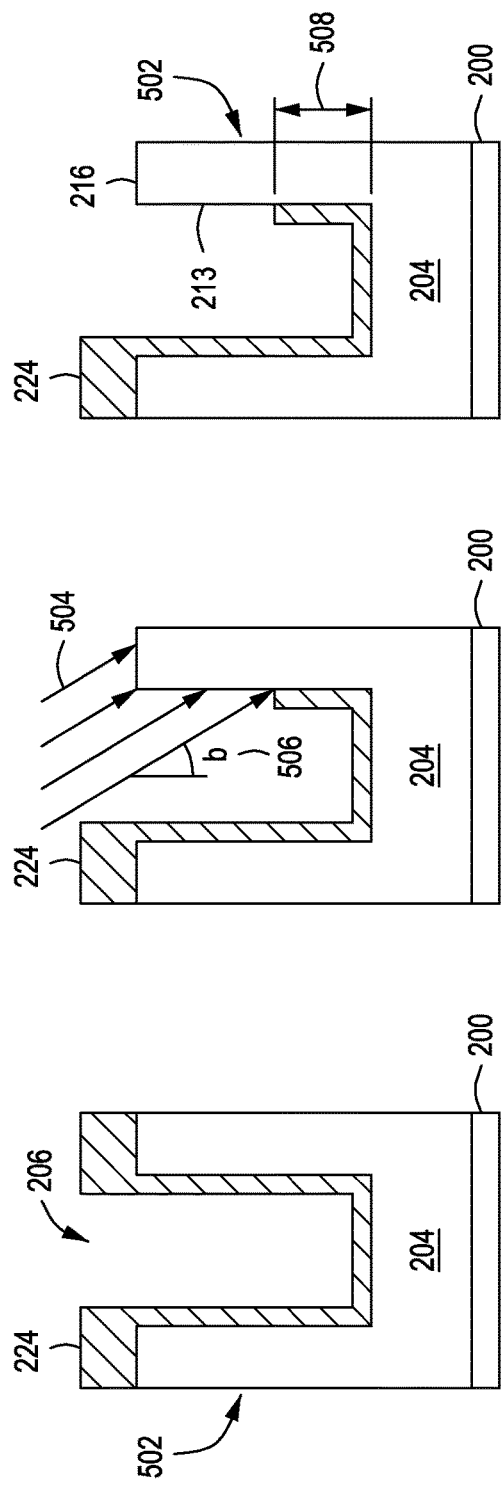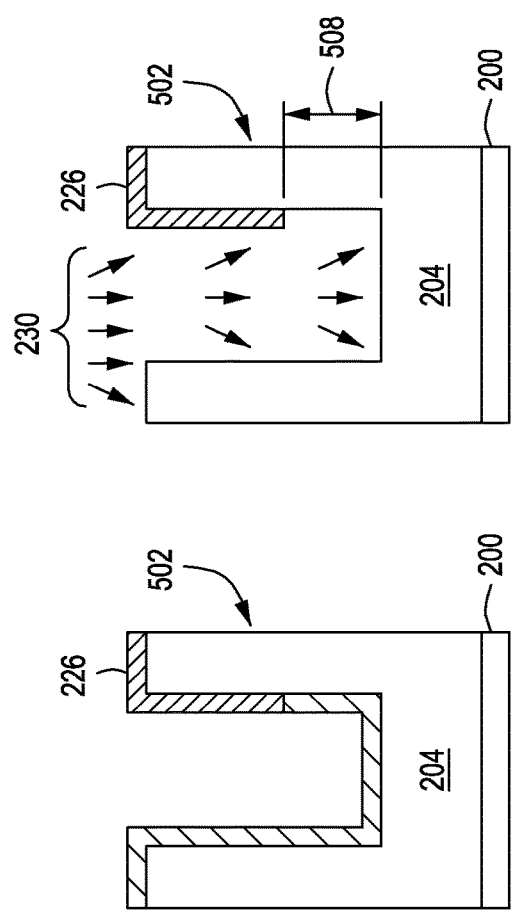

METHODS FOR ASYMMETRIC DEPOSITION OF METAL ON HIGH ASPECT RATIO NANOSTRUCTURES

FIELD

Embodiments of the present disclosure generally relate to substrate processing, and more specifically to apparatus and methods for asymmetric deposition of material on substrates.

BACKGROUND

The semiconductor processing industry generally continues to strive for increased uniformity of layers deposited on substrates. For example, with shrinking circuit sizes leading to higher integration of circuits per unit area of the substrate, increased uniformity is generally seen as desired, or required in some applications, in order to maintain satisfactory yields and thereby reduce the cost of fabrication. Various technologies have been developed to deposit layers on substrates in a cost-effective and uniform manner, such as chemical vapor deposition (CVD) or atomic layer deposition (ALD).

However, the inventors have observed that with the drive to produce equipment to deposit more uniformly, certain applications may not be adequately served where purposeful deposition is desired that is not symmetric or uniform with respect to the given structures being fabricated on a substrate.

Accordingly, the inventors have provided improved apparatus and methods for asymmetric deposition of material on substrates.

SUMMARY

Methods and apparatus for asymmetric deposition of a material on a structure formed on a substrate are provided herein. In some embodiments, a method for asymmetric deposition of a material includes forming a plasma from a process gas comprising ionized fluorocarbon (CxFy) particles, depositing an asymmetric fluorocarbon (CxFy) polymer coating on a first sidewall and a bottom portion of an opening formed in a first dielectric layer using angled CxFy ions, a metal, metallic nitride, or metallic oxide on a second sidewall of the opening, and removing the CxFy polymer coating from the first sidewall and the bottom portion of the opening to leave an asymmetric deposition of the metal, metallic nitride, or metallic oxide on the structure.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

FIGS. 5A-5E depict the stages of asymmetric deposition of material on substrates in accordance with some embodiments of the present disclosure.

Figure 1:
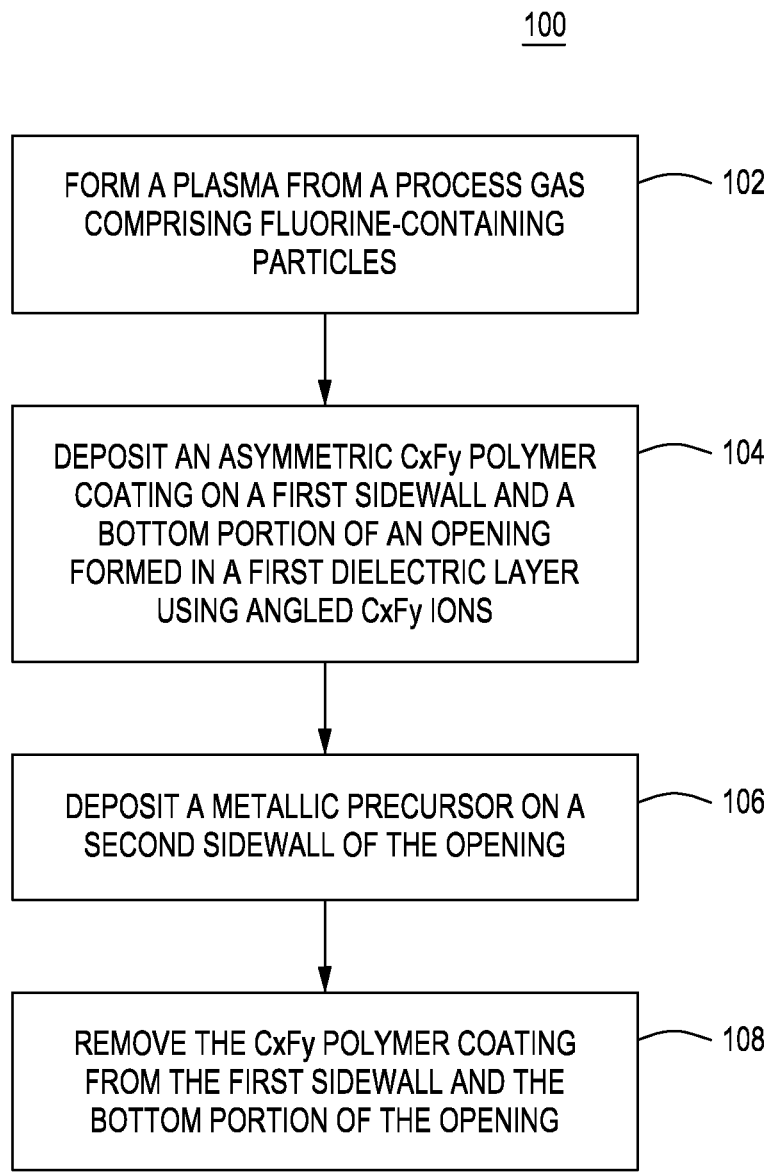
FIG. 1 depicts a flow chart of a method for asymmetric deposition of material on substrates in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus and methods for asymmetric deposition of metal on high aspect ratio nanostructures. Embodiments consistent with the present disclosure can advantageously be utilized to asymmetrically deposit metal on high aspect ratio nanostructures on 200, 300, 450 mm or larger substrates with good uniformity across whole substrate. In addition, embodiments consistent with the present disclosure can advantageously be used with a broad selection of metals to be deposited. Furthermore, embodiments consistent with the present disclosure provide a low cost, high throughput hardware design for the asymmetric deposition of metal on high aspect ratio nanostructures.

Figure 2A:
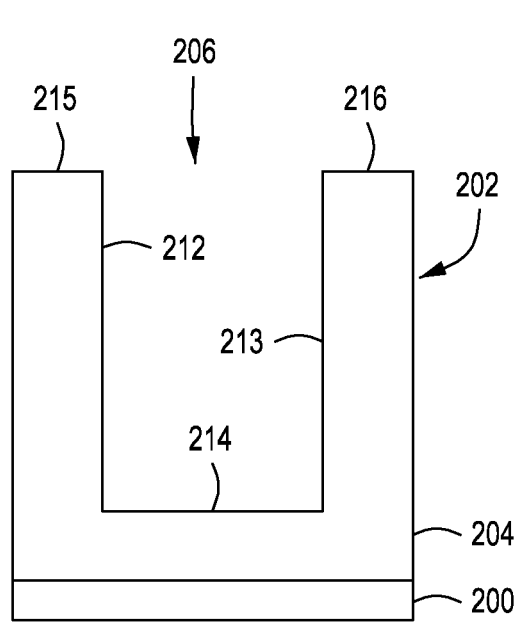
FIGS. 2A-2D depict the stages of asymmetric deposition of material on substrates in accordance with some embodiments of the present disclosure.
Figure 2B:
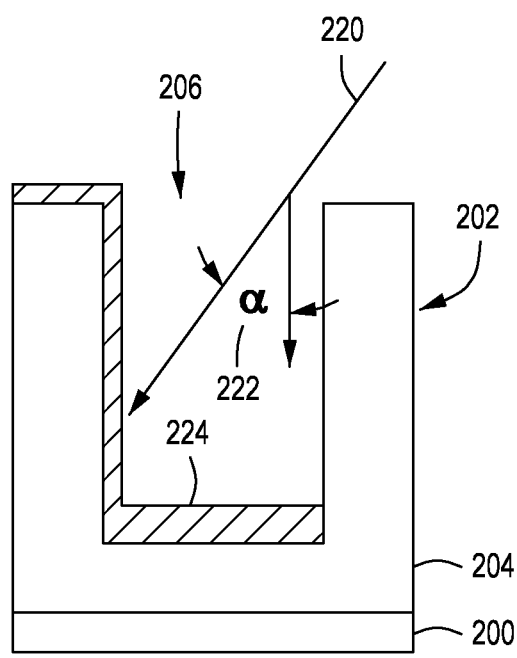
Figure 2C:
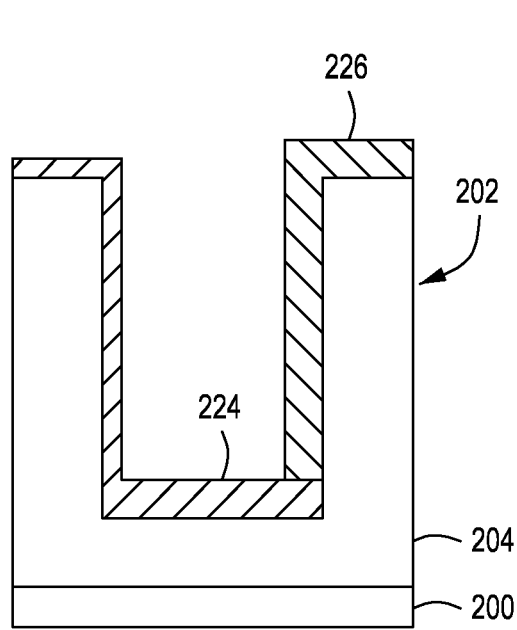
Figure 2D:
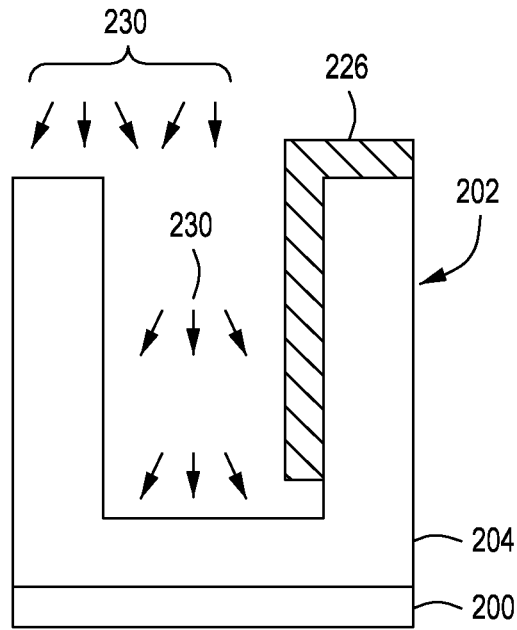

FIG. 1 depicts a flow chart of a method 100 for asymmetric deposition target material 226 on a semiconductor device structure 202 formed on the substrate surface 200 as shown in FIGS. 2A-2D. Specifically, FIG. 2D depicts schematic side view of a substrate 200 including features 202 having a layer of material 226 asymmetrically deposited thereon in accordance with at least some embodiments of the present disclosure.

The substrate 200 shown in FIGS. 2A-2D includes a semiconductor device structure 202 (e.g., such as a gate structure or other structures configured to form a contact structure) formed on the substrate 200. In some embodiments, the particular semiconductor device structure 202 may be used in three-dimensional (3-D) flash memory applications, DRAM applications, or other suitable applications with high aspect ratio or other odd geometries. The substrate 200 may comprise one or more of silicon (Si), silicon oxide ($SiO_2$), or the like.

In some embodiments, a silicon containing layer 204 is formed on the substrate 200 having openings 206 formed therein. In some embodiments, the opening may have a high aspect ratio, such as aspect ratios greater than 10:1, for example about greater than 20:1. In some embodiments, the opening 206 may between about 5 nm to about 50 nm in width. The opening 206 (which may be a contact opening, contact via, contact trench, a via, or dual damascene feature, a contact channel, or the like) is formed in the semiconductor device structure 202. In addition, the feature 202 can protrude from the substrate rather than extend into the substrate 200 or silicon containing layer 204. Each semiconductor device structure 202 includes a first sidewall 212, a side sidewall 213, a bottom 214, a left top portion 215, and a right top portion 216, which forms an open channel to expose the underlying silicon containing layer 204. It should be understood that use of relational terms such as first and second, top and bottom, left and right, and the like may be used solely to distinguish one entity or action from another entity or action without necessarily requiring or implying any actual such relationship or order between such entities or actions.

The silicon containing layer 204 may include any suitable layers such as a single silicon layer or a multiple layer film stack having at least one silicon containing layer formed therein. In the embodiment wherein the silicon containing layer 204 is in the form of a single layer, the silicon containing layer 204 may be a silicon oxide layer, an oxide layer, a silicon nitride layer, a nitride layer, a silicon oxynitride layer, a titanium nitride layer, a polysilicon layer, a microcrystalline silicon layer, a monocrystalline silicon, a doped polysilicon layer, a doped microcrystalline silicon layer, or a doped monocrystalline silicon.

The target material 226 generally contains or is a metal, metallic precursor, or a metal nitride material, such as titanium (Ti), titanium nitride (TiN), TDMAT, $TiCl_4$, alloys thereof, or combinations thereof. In some embodiments, the target material 226 deposited on features 202 may include tantalum, tungsten, cobalt, ruthenium, molybdenum, manganese, aluminum, nickel, platinum and their nitrides and oxides, as well as doping of one of the elements in the list to another element in the list. The thickness of the target material 226 deposited on features 202 may range from about 2 Angstroms to about 200 Angstroms.

Figure 3A:
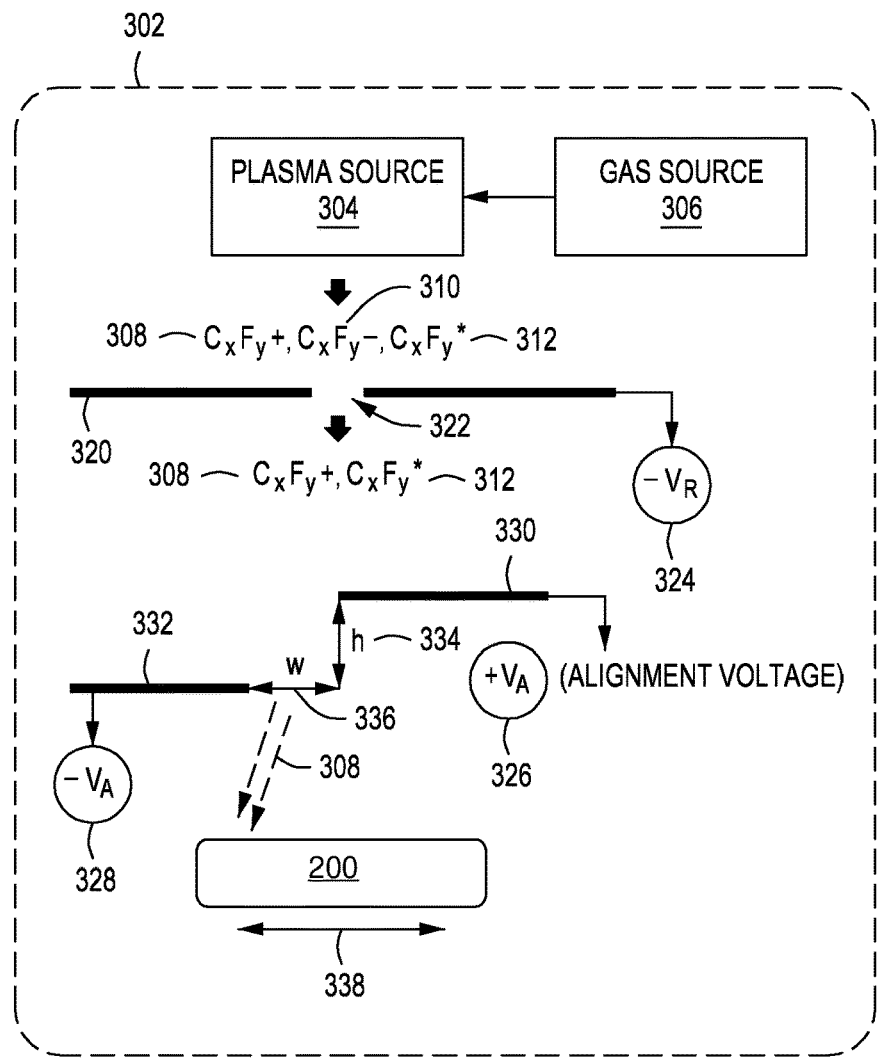
FIGS. 3A and 3B depict a schematic diagram of an apparatus used for asymmetric deposition of material on substrates in accordance with some embodiments of the present disclosure.

The method 100 is described below with respect to the stages of depositing the target material 226 on the substrate as depicted in FIGS. 2A-2D in a substrate processing chamber 302 as depicted in FIG. 3A. The method 100 begins at 102 by forming a plasma from a process gas comprising a fluorine-containing gas particles such as ionized fluorocarbon (CxFy) particles. The plasma is formed by plasma source 304 from gases supplied by gas source 306. In some embodiments, the fluorine containing gas is one of fluorine gas ($F_2$), nitrogen trifluoride ($NF_3$), a fluorocarbon ($C_xF_y$), or tungsten hexafluoride ($WF_6$). In some embodiments, the process gas further comprises one or more of oxygen gas ($O_2$), nitrous oxide ($N_2O$), or an inert gas (e.g. argon, helium, or the like) which can improve the etch rate of the cobalt material. In some embodiments, the ratio of fluorine containing gas to the one or more of oxygen gas ($O_2$), nitrous oxide ($N_2O$), or an inert gas is about 1:10 to about 10:1. In some embodiments, the flow rate of the fluorine containing gas is about 200 sccm to about 2,000 sccm.

In the description provided below, the plasma formed at 102 includes fluorocarbon polymer ions (CxFy), however, it should be understood that other ionized particles may be used. More specifically, in some embodiments, the plasma containing charged ions 220 formed at 102 includes positive CxFy polymer ions 308 (CxFy+), negative CxFy polymer ions 310 (CxFy−), and neutral CxFy polymer radicals 312 (CxFy*).

In some embodiments, the plasma source 304 is an inductively coupled plasma source. In some embodiments, the plasma source 304 is a capacitive coupled plasma source. Still, in other embodiments, the plasma source 304 may be an electron cyclotron resonator (ECR). The plasma may be formed in situ in the process chamber 208 (e.g., a direct plasma), or the plasma may be formed outside of the process chamber 208 (e.g., a remote plasma).

Next at 104, an asymmetric CxFy polymer coating 224 is deposited on a left top portion 215, a first sidewall 212 and a bottom portion 214 of an opening 206 formed in a first dielectric layer 204 using angled CxFy+ ions 308. Controlling the angle 222 at which CxFy+ ions 308 contact the surface of the substrate is accomplished by performing a number of filtering/screening/adjusting steps as follows: (1) screening out/filtering the CxFy− polymer ions 310 by applying a negative retarding potential ($-V_R$) to a first filter plate 320, (2) screening out/filtering the CxFy* radicals 312 by adjusting the positioning of the first filter plate 320, the second filter plate 330, and the third filter plate 332, (3) adjusting the angle of the path of the CxFy+ ions 308 by applying a positive alignment voltage ($+V_A$) to the second filter plate 330, and (4) adjusting the angle and/or speed of the CxFy+ ions 308 by applying a negative voltage ($-V_R$) to the third filter plate 332. Each of these four steps are described below in further detail.

Figure 3B:
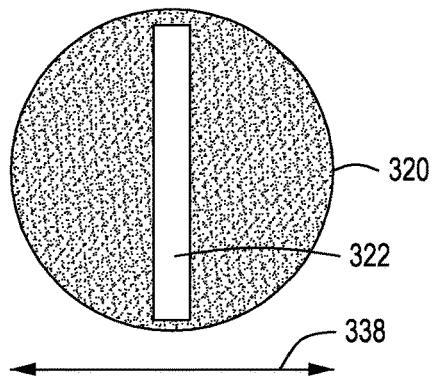

First, the CxFy− polymer ions 310 are screened/filtered by applying a negative retarding potential $-V_R$ to the first filter plate 320 via the first DC source 324. In some embodiments, the first DC source 324 is configured to apply from about −2 kVolts to about −10 kVolts. The first filter plate 320 can be made of any electrically conductive material that can be charged to attract the negative CxFy− 310 ions. In some embodiments, the first filter plate 320 is made from aluminum or stainless steel. In some embodiments, the first filter plate 320 may be disc shaped and have a diameter larger that the diameter of the substrate being processed. In some embodiments, the first filter plate 320 is configured to move vertically and or laterally. In some embodiments, the vertical and lateral position of the filter disc may be used to alter the angle of the path of the CxFy+ polymer ions 308 and CxFy* radicals 312. The first filter plate 320 includes at least one opening 322 that allows that the CxFy+ polymer ions 308 and CxFy* radicals 312 to pass through while the CxFy− ions 310 are filtered by way of electrical attraction to the filter plate 320. In some embodiments, the at least one opening 322 is one or more rectangular formed in the filter plate 320 as shown in the top down view of the filter plate 320 in FIG. 3B. In some embodiments, the at least one opening 322 may be one or more holes, ellipses, or other shape formed through the filter plate 320 to allow the non-filtered CxFy polymer ions to pass through. In some embodiments, the at least one opening 322 is longer than the diameter of the substrate being processed.

Second, the CxFy* radicals 312 are screened out by the geometries and positioning of the first filter plate 320, the second filter plate 330, and the third filter plate 332, each of which can be independently moved vertically or laterally. Since the CxFy* radicals 312 are neutral and not affected by the retarding or alignment voltages applied, they fall straight down (i.e., line of sight). Thus, they are prevented from reaching the substrate surface by adjusting the position of the first filter plate 320, the second filter plate 330, and the third filter plate 332 with respect to each other. In some embodiments, the second filter plate 330 may be similar to the first filter plate described above. In some embodiments, the second filter plate 330 may be attached to a movable arm extending in from a sidewall of the process chamber.

Third, the angle of the path of the CxFy+ ions 308 is adjusted by applying a positive alignment voltage ($+V_A$) to the second filter plate 330. In some embodiments, the second DC source 326 is configured to apply from about +2 kVolts to about +10 kVolts. In some embodiments, the angle of the path of the CxFy+ ions 308 is further adjusted by adjusting the height (h) 334 of the second filter plate 330 from the third filter plate 332, and/or the width (w) 336 of the opening between the second filter plate 330 and the third filter plate 332. In some embodiments, the height 334 of the second filter plate 330 from the third filter plate 332 may be about 3 mm to about 100 In some embodiments, the width 336 of the opening between the second filter plate 330 and the third filter plate 332 may be about 0.1 mm to about 50 mm.

Fourth, the angle and/or energy of the CxFy+ ions 308 may be further adjusted or controlled by applying a negative alignment voltage ($-V_A$) to the third filter plate 332 using DC voltage source 328. The energy of the CxFy+ ions 308 refers to the speed and/or temperature of the CxFy+ ions 308. In particular, the temperature may be controlled since it affects the conversion of the fluorocarbon ions to a polymer. Furthermore, if the energy of the CxFy+ ions 308 is too high, it could cause damage to the underlying dielectric layer. In some embodiments, all of the DC voltage sources 324, 326, and 328 may be separate sources and independently controlled, or they be the source DC voltage source configured to supply the aforementioned voltages at the desired levels and times.

Furthermore, in some embodiments, the substrate 200 may also be moved laterally as shown by arrow 338 to ensure uniform deposition of the CxFy+ ions 308 on all features 202 formed on the substrate. Finally, in some embodiments the above process is performed at a pressure of less than 100 millitorr, or below the negative retarding potential ($-V_R$). In some embodiments, the pressure is adjustable to control the number of ion collisions.

At step 106 of method 100, after the asymmetric CxFy polymer coating is deposited as shown in FIG. 2B on the left top portion 215, a first sidewall 212 and a bottom portion 214 of opening 206, the target material 226 (e.g., metals and its nitrides and oxides, such as Ti or TiN) is then deposited on the second sidewall 213 and right top portion 216 of the opening 206 as shown in FIG. 2C. Specifically, the target material 226 deposited on the substrate cannot nucleate on the fluorocarbon 224 deposited (i.e., the CxFy+ ions 308) on the left top portion 215, a first sidewall 212 and a bottom portion 214 of the opening 206. The target material 226 can be sputtered or provided to the surface of the substrate 200 through conventional chemical vapor deposition (CVD) or atomic layer deposition (ALD) apparatus and methods.

At 108, the CxFy polymer coating is removed from the first sidewall and the bottom portion of the opening by using a hydrogen ($H_2$) or oxygen ($O_2$) based treatment. The $H_2$ or $O_2$ treatment may be performed using a $H_2$ or $O_2$ gas treatment, or a remote plasma treatment. Other oxidative processing treatments may be used to remove the CxFy polymer coating. The resulting structure having an asymmetric deposition of target material 226 is shown in FIG. 2D. As shown in FIG. 2D, the target material 226 is deposited on the top right portion 216 and the second sidewall 213. The target material 226 does not contact the bottom portion 214 or the first side wall 212.

Figure 4:
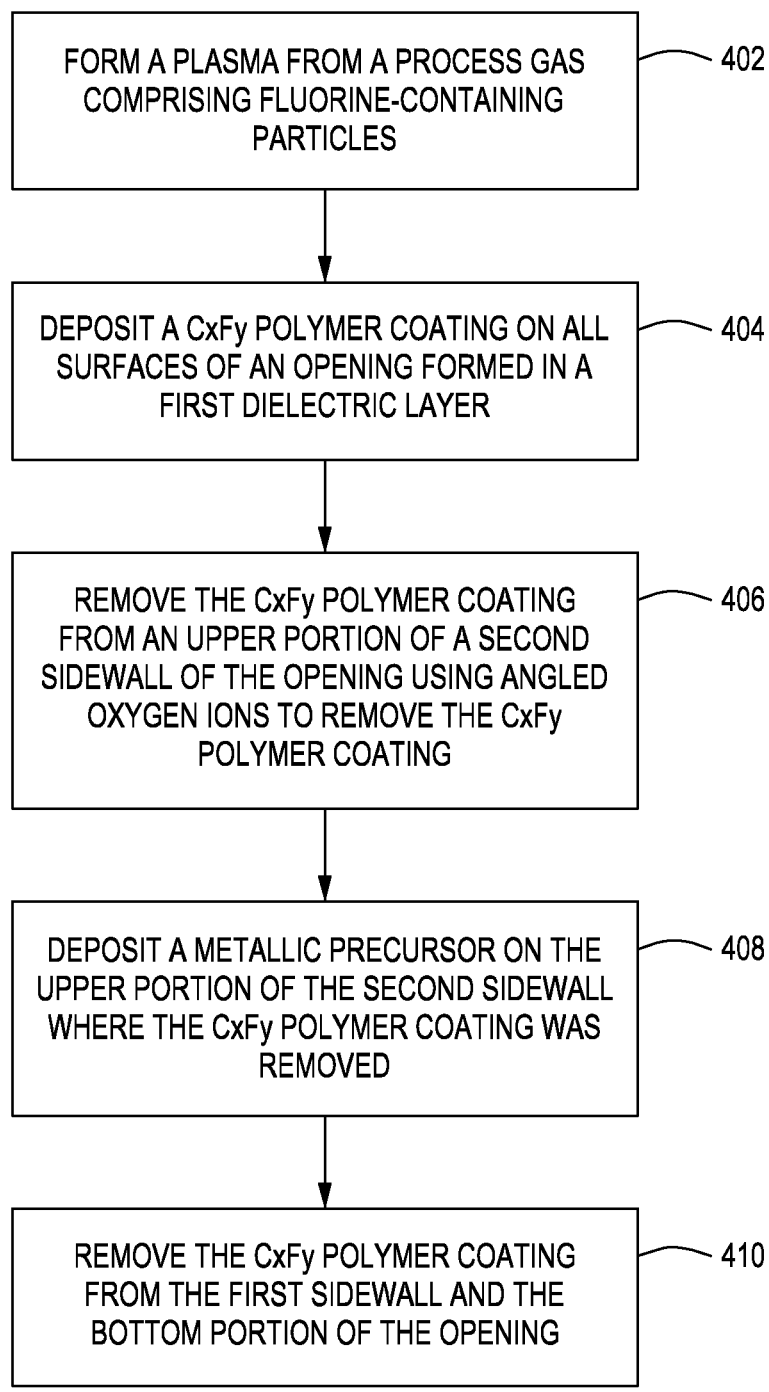
FIG. 4 depicts a flow chart of a another method for asymmetric deposition of material on substrates in accordance with some embodiments of the present disclosure.

FIG. 4 depicts a flow chart of another method 400 for asymmetric deposition target material 226 on a semiconductor device structure 502 formed on the substrate surface 200 as shown in FIGS. 5A-5E. Specifically, FIG. 5E depicts schematic side view of a substrate 200 including features 502 having a layer of material 226 asymmetrically deposited thereon in accordance with at least some embodiments of the present disclosure.

The substrate 200 shown in FIGS. 5A-5E includes a semiconductor device structure 502 (e.g., such as a gate structure or other structures configured to form a contact structure) formed on the substrate 200. In some embodiments, the particular semiconductor device structure 502 may be used in three-dimensional (3-D) flash memory applications, DRAM applications, or other suitable applications with high aspect ratio or other odd geometries. The substrate 200 may comprise one or more of silicon (Si), silicon oxide ($SiO_2$), or the like.

All other aspects of the structure 502 shown in FIGS. 5A-5E where the same references numbers are used are similar/same as those described above with respect to FIGS. 2A-2D.

Figure 6:
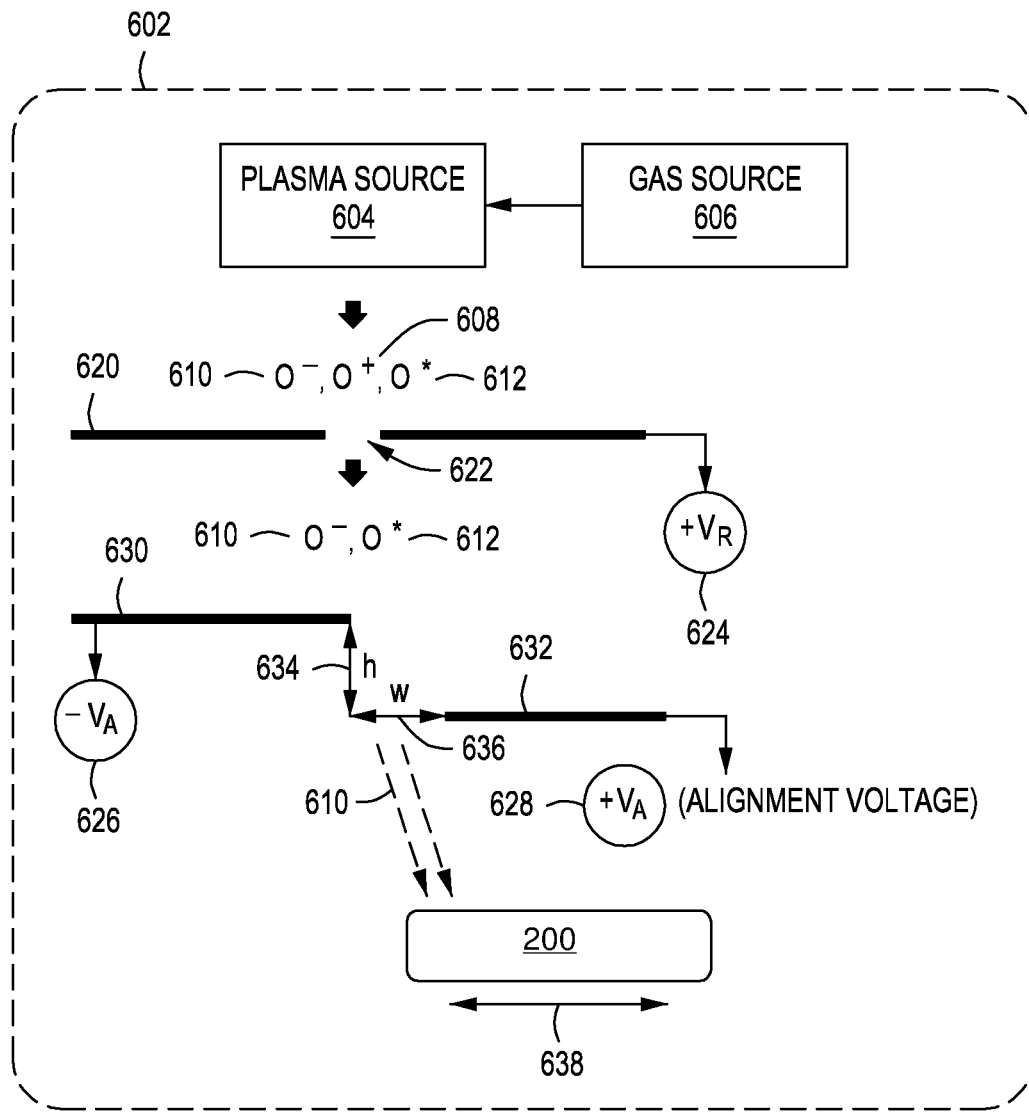
FIG. 6 depicts a schematic diagram of an apparatus used for asymmetric deposition of material on substrates in accordance with some embodiments of the present disclosure.

The method 400 is described below with respect to the stages of depositing the target material 226 on the substrate as depicted in FIGS. 5A-5E in a substrate processing chamber 602 as depicted in FIG. 6. The method 400 begins at 402 by forming a plasma from a process gas comprising a fluorine-containing gas particles (e.g., ionized fluorocarbon (CxFy) particles) as described above with respect to FIGS. 1 and 3.

At 404, a CxFy polymer coating 224 is conformally deposited on all surfaces of an opening 206 formed in a first dielectric layer 204 as shown in FIG. 5A (i.e., on the first sidewall 212, the second sidewall 213, the bottom portion 214, the top left portion 215, and the top right portion 216).

At 406, the CxFy polymer coating 224 is removed from an upper portion of the second sidewall 213 and the top right portion 216 of the opening 206 using angled oxygen ions 504 to remove the CxFy polymer coating 224. The oxygen ions 504 are formed in a plasma by plasma source 604 from gases supplied by gas source 606. The plasma containing charged oxygen ions 504 formed includes positive oxygen ions 608 (O+), negative oxygen ions 610 (O−), and neutral oxygen radicals 612 (O*).

Controlling the angle 506 at which oxygen ions 504 contact the surface of the substrate is accomplished by performing a number of filtering/screening/adjusting steps as follows: (1) screening out/filtering the O+ ions 608 by applying a positive retarding potential ($+V_R$) to a first filter plate 620, (2) screening out/filtering the O* radicals 612 by adjusting the positioning of the first filter plate 620, the second filter plate 630, and the third filter plate 632, (3) adjusting the angle of the path of the O− ions 610 by applying an negative alignment voltage ($-V_A$) to the second filter plate 630, and (4) adjusting the angle and/or speed of the O− ions 610 by applying a positive alignment voltage ($+V_A$) to the third filter plate 632. Each of these four steps are described below in further detail. By controlling the angle 506 at which oxygen ions 504 contact the surface, the height 508 of the CxFy polymer coating 224 left on the second sidewall 213 can be precisely controlled or tuned.

First, the O+ ions 608 are screened/filtered by applying a positive retarding potential $+V_R$ to the first filter plate 620 via the first DC source 624. In some embodiments, the first DC source 624 is configured to apply from about +2 kVolts to about +10 kVolts. The first filter plate 620 can be made of any electrically conductive material that can be charged to attract the O+ ions 608. In some embodiments, the first filter plate 620 is made from aluminum or stainless steel. In some embodiments, the first filter plate 620 may be disc shaped and have a diameter larger that the diameter of the substrate being processed. In some embodiments, the first filter plate 620 is configured to move vertically and or laterally. In some embodiments, the vertical and lateral position of the filter disc may be used to alter the angle of the path of the O− ions 610 and O* radicals 612. The first filter plate 620 includes at least one opening 622 that allows that the O− ions 310 and O* radicals 612 to pass through while the O+ ions 608 are filtered by way of electrical attraction to the filter plate 620.

In some embodiments, the at least one opening 622 is one or more rectangular formed in the filter plate 620. In some embodiments, the at least one opening 622 may be one or more holes, ellipses, or other shape formed through the filter plate 620 to allow the non-filtered Oxygen ions to pass through. In some embodiments, the at least one opening 622 is longer than the diameter of the substrate being processed.

Second, the O* radicals 612 are screened out by the geometries and positioning of the first filter plate 620, the second filter plate 630, and the third filter plate 632, each of which can be independently moved vertically or laterally. Since the O* radicals 612 are neutral and not affected by the retarding or alignment voltages applied, they fall straight down (i.e., line of sight). Thus, they are prevented from reaching the substrate surface by adjusting the position of the first filter plate 620, the second filter plate 630, and the third filter plate 632 with respect to each other. In some embodiments, the second filter plate 630 may be similar to the first filter plate described above. In some embodiments, the second filter plate 630 may be attached to a movable arm extending in from a sidewall of the process chamber.

Third, the angle of the path of the O− ions 610 is adjusted by applying a negative alignment voltage ($-V_A$) to the second filter plate 630. In some embodiments, the second DC source 626 is configured to apply from about −2 kVolts to about −10 kVolts. In some embodiments, the angle of the path of the O− ions 610 is further adjusted by adjusting the height (h) 634 of the second filter plate 630 from the third filter plate 632, and/or the width (w) 636 of the opening between the second filter plate 630 and the third filter plate 632. In some embodiments, the height 634 of the second filter plate 630 from the third filter plate 632 may be about 3 mm to about 100 mm. In some embodiments, the width 636 of the opening between the second filter plate 630 and the third filter plate 632 may be about 0.1 mm to about 50 mm.

Fourth, the angle and/or energy of the O− ions 610 may be further adjusted or controlled by applying a positive voltage ($+V_A$) to the third filter plate 362 using DC voltage source 628. The energy of the O− ions 610 refers to the speed and/or temperature of the O− ions 610. In some embodiments, all of the DC voltage sources 624, 626, and 628 may be separate sources and independently controlled, or they be the source DC voltage source configured to supply the aforementioned voltages at the desired levels and times.

Furthermore, in some embodiments, the substrate 200 may also be moved laterally as shown by arrow 638 to ensure uniform deposition of the O− ions 610 on all features 202 formed on the substrate. Finally, in some embodiments the above process is performed at a pressure of less than 100 millitorr, or below the positive retarding potential ($+V_R$). In some embodiments, the pressure is adjustable to control the number of ion collisions.

At step 408, the target material 226 (e.g., metals and its nitrides and oxides, such as Ti or TiN) is then deposited on the second sidewall 213 and right top portion 216 of the opening 206 as shown in FIG. 5D. Specifically, the target material 226 deposited on the substrate cannot nucleate on the fluorocarbon 224 deposited along the opening 206. The target material 226 can be sputtered or provided to the surface of the substrate 200 through conventional chemical vapor deposition (CVD) or atomic layer deposition (ALD) apparatus and methods.

At 110, the CxFy polymer coating is removed from all surfaces of the opening on which it remains by using a hydrogen ($H_2$) or oxygen ($O_2$) based treatment. The $H_2$ or $O_2$ treatment may be performed using a $H_2$ or $O_2$ gas treatment, or a remote plasma treatment. Other oxidative processing treatments may be used to remove the CxFy polymer coating. The resulting structure having an asymmetric deposition of target material 226 is shown in FIG. 5E. As shown in FIG. 5E, the target material 226 is deposited on the top right portion 216 and a portion of the second sidewall 213. The target material 226 does not contact the bottom portion 214 or the first side wall 212. Furthermore, the height 508 of the target material 226 from the bottom surface is shown in FIG. 5E and is tunable as discussed above with respect to step 406.

While the foregoing is directed to embodiments of the present disclosure, other and further embodiments of the disclosure may be devised without departing from the basic scope thereof.

The invention claimed is:

1. Method for asymmetric deposition of a material on a structure formed on a substrate, comprising:
    forming a plasma from a process gas comprising ionized fluorocarbon (CxFy) particles;
    depositing an asymmetric CxFy polymer coating on a first sidewall and a bottom portion of an opening formed in a first dielectric layer using angled CxFy ions;
    depositing a metal, metallic nitride, or metallic oxide on a second sidewall of the opening; and
    removing the CxFy polymer coating from the first sidewall and the bottom portion of the opening to leave an asymmetric deposition of the metal, metallic nitride, or metallic oxide on the structure.

2. The method of claim 1, wherein the ionized CxFy particles include positive CxFy+ polymer ions, negative CxFy− polymer ions, and CxFy* radicals.

3. The method of claim 2, wherein depositing an asymmetric fluorocarbon (CxFy) polymer coating on a first sidewall and a bottom portion of the opening includes filtering the CxFy− polymer ions by applying a negative retarding potential ($V_R$) to a first filter plate.

4. The method of claim 2, wherein depositing an asymmetric fluorocarbon (CxFy) polymer coating on a first sidewall and a bottom portion of the opening includes filtering the CxFy* radicals by adjusting a positioning of at least one of a first filter plate, a second filter plate, or a third filter plate.

5. The method of claim 2, wherein depositing an asymmetric fluorocarbon (CxFy) polymer coating on a first sidewall and a bottom portion of the opening includes adjusting an angle of a path of the CxFy+ ions by applying a positive alignment voltage ($+V_A$) to a second filter plate.

6. The method of claim 2, wherein depositing an asymmetric fluorocarbon (CxFy) polymer coating on a first sidewall and a bottom portion of the opening includes adjusting an angle and/or speed of the CxFy+ ions by applying a negative alignment voltage ($-V_A$) to a third filter plate.

7. The method of claim 2, wherein depositing an asymmetric fluorocarbon (CxFy) polymer coating on a first sidewall and a bottom portion of the opening includes:
    filtering the CxFy− polymer ions by applying a negative retarding potential ($V_R$) to a first filter plate;
    filtering the CxFy* radicals by adjusting a positioning of at least one of the first filter plate, a second filter plate, or a third filter plate;
    adjusting an angle of a path of the CxFy+ ions by applying a positive alignment voltage ($+V_A$) to the second filter plate; and adjusting the angle and/or speed of the CxFy+ ions by applying a negative alignment voltage ($-V_A$) to the third filter plate.

8. The method of claim 1, wherein the CxFy polymer coating is removed from the first sidewall and the bottom portion of the opening using using a hydrogen ($H_2$) or oxygen ($O_2$) based gas treatment.

9. The method of claim 1, wherein the metal, metallic nitride, or metallic oxide asymmetrically deposited includes at least one of titanium (Ti), titanium nitride (TiN), TDMAT, $TiCl_4$, alloys thereof, or combinations thereof.

10. The method of claim 1, wherein the metal, metallic nitride, or metallic oxide asymmetrically deposited includes at least one of tantalum, tungsten, cobalt, ruthenium, molybdenum, manganese, aluminum, nickel, platinum, or their nitrides or oxides.

11. Method for asymmetric deposition of a material on a structure formed on a substrate, comprising:
    forming a plasma from a process gas comprising ionized fluorocarbon (CxFy) particles;
    deposit a fluorocarbon (CxFy) polymer coating on all surfaces of an opening formed in a first dielectric layer;
    remove the CxFy polymer coating from an upper portion of a second sidewall of the opening using angled charged oxygen ions to remove a portion of the CxFy polymer coating;
    deposit a metal, metallic nitride, or metallic oxide on the upper portion of the second sidewall where the CxFy polymer coating was removed; and
    removing the remainder of the CxFy polymer coating from a first sidewall and a bottom portion of the opening to leave an asymmetric deposition of the metal, metallic nitride, or metallic oxide on the structure.

12. The method of claim 11, wherein the oxygen ions include positive oxygen (O+) ions, negative oxygen (O−) ions, and oxygen (O*) radicals.

13. The method of claim 12, wherein removing the CxFy polymer coating from an upper portion of a second sidewall of the opening using angled charged oxygen ions includes at least one of:
    filtering the O+ ions by applying a positive retarding potential ($+V_R$) to a first filter plate;
    filtering the O* radicals by adjusting a positioning of at least one of the first filter plate, a second filter plate, or a third filter plate;
    adjusting an angle of a path of O− ions by applying a negative alignment voltage ($-V_A$) to the second filter plate; or
    adjusting the angle and/or speed of the O− ions by applying a positive alignment voltage ($+V_A$) to the third filter plate.

14. The method of claim 11, wherein the remainder of the CxFy polymer coating from the first sidewall and the bottom portion of the opening using a hydrogen ($H_2$) or oxygen ($O_2$) based gas treatment.

* * * * *

UNITED STATES PATENT AND TRADEMARK OFFICE
CERTIFICATE OF CORRECTION

PATENT NO.         : 10,636,655 B2
APPLICATION NO.    : 15/924821
DATED              : April 28, 2020
INVENTOR(S)        : Ben-Li Sheu et al.

Page 1 of 1

It is certified that error appears in the above-identified patent and that said Letters Patent is hereby corrected as shown below:

In the Claims

Column 5, Line 5, delete "about 100 In some" and insert --about 100 mm. In some--.

Signed and Sealed this
Ninth Day of June, 2020

Andrei Iancu
*Director of the United States Patent and Trademark Office*